US006593809B2

(12) United States Patent
Hahn et al.

(10) Patent No.: US 6,593,809 B2
(45) Date of Patent: Jul. 15, 2003

(54) CIRCUIT FOR WIDENING THE STEREOBASE IN THE REPRODUCTION OF STEREOPHONIC SOUND SIGNALS

(75) Inventors: Andreas Hahn, Freising (DE); Juergen Schneider, Ebersberg (DE)

(73) Assignee: Texas Instruments Deutschland, GmbH, Freising (DE)

(*) Notice: Subject to any disclaimer, the term of this patent is extended or adjusted under 35 U.S.C. 154(b) by 0 days.

(21) Appl. No.: 09/993,403

(22) Filed: Nov. 5, 2001

(65) Prior Publication Data

US 2002/0113646 A1 Aug. 22, 2002

(30) Foreign Application Priority Data

Nov. 22, 2000 (DE) ........................................ 100 57 897

(51) Int. Cl.[7] .................................................. H03F 3/45

(52) U.S. Cl. ..................... 330/69; 330/124 R; 381/120; 381/121

(58) Field of Search .............................. 330/69, 124 R; 381/120, 121

(56) References Cited

U.S. PATENT DOCUMENTS 5,509,078 A * 4/1996 Hiraoka et al. ......... 330/124 R
5,610,555 A * 3/1997 Funahashi et al. .......... 330/107
5,621,352 A * 4/1997 Botti et al. .................... 330/51
5,914,636 A * 6/1999 Brisson .................. 330/124 R
5,973,555 A * 10/1999 Kokubo et al. ................ 330/2
6,181,796 B1 * 1/2001 Johnson ....................... 381/28

* cited by examiner

*Primary Examiner*—Michael Tokar
*Assistant Examiner*—Linh Van Nguyen
(74) *Attorney, Agent, or Firm*—Bret J. Petersen; W. James Brady, III; Frederick J. Telecky, Jr.

(57) ABSTRACT

A circuit for widening the stereobase in the reproduction of stereophonic sound signals contains one amplifier (10, 34) each for the stereo signals assigned to the right-hand and left-hand channel. Each amplifier (10, 34) comprises a non-inverting input (16, 36) for the corresponding stereo signal and an inverting input (18, 42) for an output signal fed back via a first resistor (R1, R5) from the amplifier output (20, 40). An ON/OFF connection is provided between the inverting inputs (18, 42) of both amplifiers (10, 34). The connection between the inverting inputs (18, 42) of the two amplifiers (10, 34) is formed by two amplifiers (48, 50) circuited in antiparallel as voltage followers and a second resistor (R8, R9) connected in series with the output of each amplifier (48, 50). The amplifiers (48, 50) circuited as voltage followers comprise a blocking input (64, 66) by which the amplifiers can be switched to an inactive state on application of a blocking signal in which they communicate no signal to their output.

10 Claims, 1 Drawing Sheet

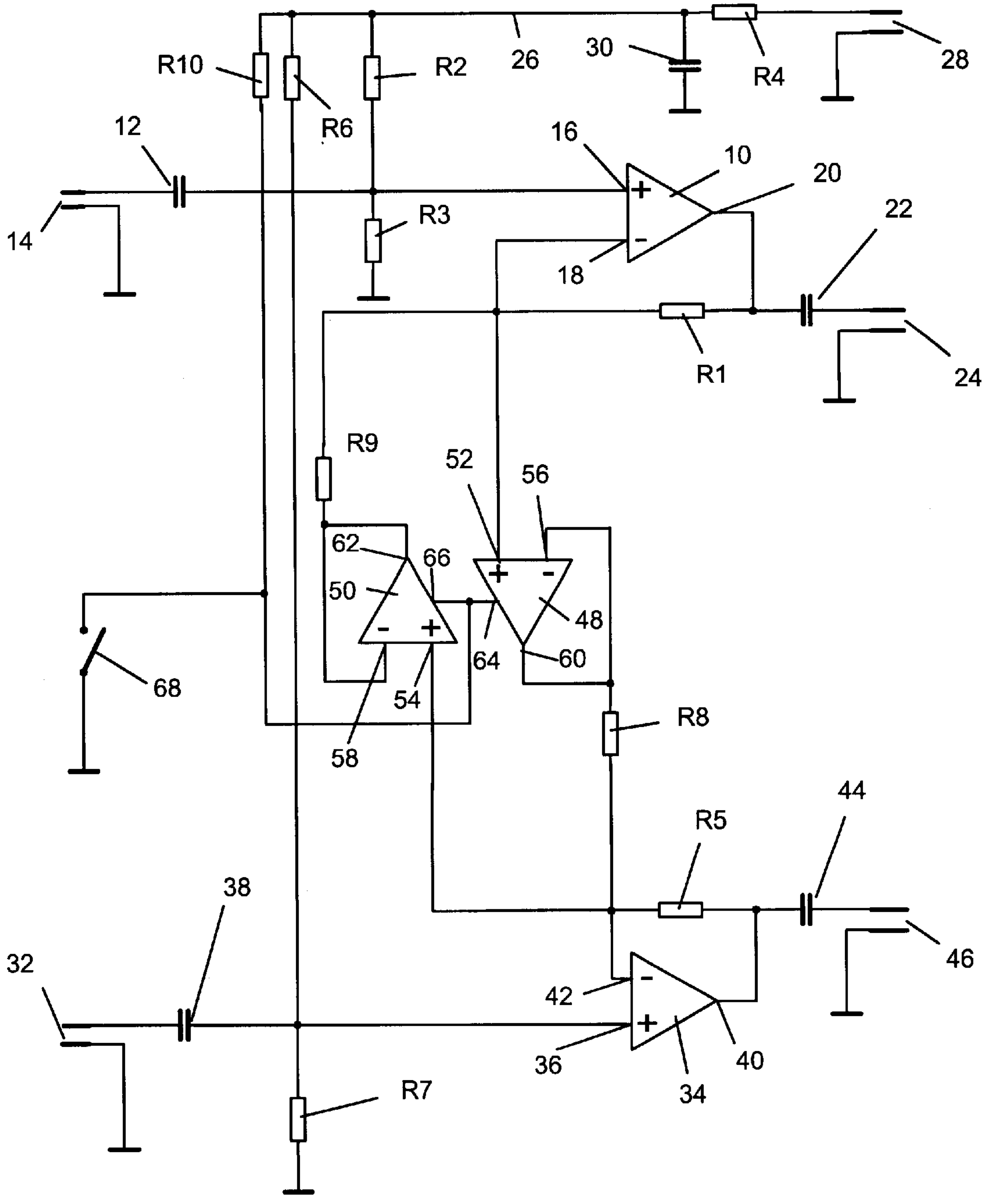
R10
R6
R2
26
30
R4
28
12
16
10
20
22
14
R3
18
R1
24
R9
52
56
62
66
50
48
64
60
68
54
58
R8
R5
44
38
32
42
36
34
40
46
R7

CIRCUIT FOR WIDENING THE STEREOBASE IN THE REPRODUCTION OF STEREOPHONIC SOUND SIGNALS

FIELD OF THE INVENTION

The invention relates to a circuit for widening the stereobase in the reproduction of stereophonic sound signals, including one amplifier each for stereo signals assigned to the right-hand and left-hand channel, each amplifier comprising a non-inverting input for the corresponding stereo signal and an inverting input for an output signal fed back via a resistor from the amplifier output, and an ON/OFF connection between the inverting inputs of both amplifiers.

BACKGROUND OF THE INVENTION

Portable sound reproducing instruments despite increasing miniaturization are required to satisfy all requirements as to reproduction quality at least as regards the electronic signal processing. Due to the small dimensions of these instruments the spacing between the loudspeakers to which the signals of the right-hand channel and left-hand channel are applied for the reproduction of stereophonic sound signals, however, becomes so small that the stereophonic effect is seriously degraded, good stereophonic reproduction necessitating a relatively large spacing between the loudspeakers. Proposals have thus been made to achieve a virtual increase in the spacing of the loudspeakers, the so-called stereobase, by influencing the signals applied to the loudspeakers.

Known from DE 39 14 681 C2 is a circuit assembly of the aforementioned kind with the aid of which the stereobase can be widened virtually so that despite a small spacing of the loudspeakers the spatial sound impression is improved. In this known circuit assembly a switch formed by a field-effect transistor and a filter are provided in the connection of the inverting inputs of the amplifiers assigned to the two channels. Using a field-effect transistor as the switch in the connection of the inverting inputs necessitates generating a control voltage for this field-effect transistor when the usual electronic components of the circuit assembly are equipped with advanced devices making do with low supply voltages of, for example, lower than 3 V. Apart from this it is a nuisance having to provide a switch in the connection via which the sound signals are communicated.

SUMMARY OF THE INVENTION

An objective of the invention is to configure a circuit assembly of the aforementioned kind so that it can be put to use even at low supply voltages. Further, an objective is to achieve an ON/OFF base widening effect without a switch being needed in the connection via which the sound signals are communicated.

An embodiment of the invention includes a pair of amplifiers for stereophonic sound signals with a connection between the inverting inputs of the two amplifiers formed by two amplifiers connected in antiparallel as voltage followers and a second resistor connected in series with the output of each amplifier. Further, in another embodiment, a blocking input by which the amplifiers can be switched to an inactive state on application of a blocking signal in which they communicate no signal to their output.

The circuit in accordance with the invention permits widening the stereobase by simple ways and means whereby signaling the widening effect ON/OFF is possible without degrading the sound signals, the widening extent being influenced very simply by the selection of passive devices.

BRIEF DESCRIPTION OF THE DRAWING

An example embodiment of the invention will now be detailed with reference to the drawings, the sole FIGURE of which shows the circuit diagram of the circuit assembly in accordance with the invention.

DETAILED DESCRIPTION OF THE EMBODIMENTS

The circuit assembly as shown in the drawing contains a first amplifier 10 to which the sound signals of the right-hand channel to be amplified are applied via a coupling capacitor 12. These sound signals are applied to an input terminal 14. The amplifier 10 is an operational amplifier having a non-inverting input 16 and an inverting input 18. As evident, the sound signal is applied to the non-inverting input 16. The output 20 of the amplifier is connected via a resistor R1 to the inverting input 18 and it acts as a non-inverting amplifier meaning that it has a high input impedance and a low output impedance. The output signal of the amplifier 10 is communicated via a coupling capacitor 22 to the output terminal 24 for the right-hand channel. By means of a voltage divider made up of two series resistors R2 and R3 connected between a supply voltage lead 26 and ground a bias voltage is applied to the non-inverting input 16 of the amplifier 10. The supply voltage applied to a terminal 28 gains access via a filter network made up of a resistor R4 and a capacitor 30 to the supply voltage lead 26.

The sound signals of the left-hand channel applied to an input terminal 32 are amplified in an amplifier 34 which is connected just the same as the amplifier 10 assigned to the right-hand channel. This means in particular that this amplifier receives at its non-inverting input 36 the sound signals via a coupling capacitor 38 and that its output 40 is connected to the inverting input 42 via a resistor R5. The output signals of the left-hand channel are communicated via a coupling capacitor 44 from the amplifier output 40 to the output terminal 46. Via a voltage divider R6 and R7 between the supply voltage lead 26 and ground a bias voltage is applied to the non-inverting input 36 of the amplifier 34.

The inverting inputs 18 and 42 of the two amplifiers 10 and 34 respectively are connected via two amplifiers 48 and 50 connected in antiparallel and a resistor R8 and R9 connected to each amplifier respectively. The amplifiers 48 and 50 are likewise operational amplifiers having a non-inverting input and an inverting input. The non-inverting input 52 of the amplifier 48 is connected to the inverting input 18 of the amplifier 10 and the non-inverting input 54 of the amplifier 50 is connected to the inverting input 42 of the amplifier 34. In the two amplifiers 48 and 50 each inverting input 56 and 58 is connected to the amplifier output 60 and 62 respectively. At the same time the output 60 of amplifier 48 is connected via the resistor R8 to the inverting input 42 of amplifier 34 while the output 62 of amplifier 50 is connected via the resistor R9 to the inverting input 18 of amplifier 10. Each of the amplifiers 48 and 50 comprise a blocking input 64 and 66 respectively. By applying a blocking signal to this input these amplifiers can be deactivated so that no signal is communicated to their corresponding output.

Depending on the position of the switch 68 the blocking 25 signal has either ground potential or the potential of the supply voltage lead 26. This is achieved by the two interconnected blocking inputs 64 and 66 being connected via a resistor R10 to the supply voltage lead 26 and via the switch 68 to ground. When the switch 68 is open the voltage existing at the supply voltage lead 26 is applied to the blocking inputs while when switch 68 is closed the blocking inputs 64 and 66 are at ground potential.

In the circuit assembly as shown in the drawing the amplifiers 48 and 50 act purely as voltage followers, meaning that they do not amplify the voltage applied to them so that their input voltage equals their output voltage.

When switch 68 is closed the blocking inputs 64 and 66 of amplifiers 48 and 50 respectively are at ground potential, resulting in amplifiers 48 and 50 being OFF so that no connection exists between amplifiers 10 and 34. The sound signals applied to the input terminals 14 and 32 are thus amplified exclusively by amplifiers 10 and 34 respectively and communicated to the outputs 24 and 46 once suitably amplified. The sound signals are thus totally unable to influence each other so that the stereophonic effect generated by the sound signals in being emitted by the two loudspeakers exclusively depends on the actual spacing of the two loudspeakers from each other, i.e. the spatial effect in the case of small portable instruments due to the small spacing of the loudspeakers is present to only a very minor degree and, circumstances permitting, may even not be evident at all.

Opening the switch 68 renders the amplifiers 48 and 50 active resulting in part of the signal of the right-hand channel being applied via amplifier 48 and resistor R8 to the amplifier 34 of the left-hand channel while part of the signal of the left-hand channel is applied via amplifier 50 and resistor R9 to amplifier 10 of the right-hand channel. The signals output at output terminals 24 and 46 can be represented as follows in the frequency range uninfluenced by the coupling capacitors (12, 22, 38, 44) and input and output resistors respectively of the circuit:

$$\text{Vout\_l} = \text{Vin\_l} + (\text{Vin\_l} - \text{Vin\_r}) \times \frac{R1}{R9}$$

$$\text{Vout\_r} = \text{Vin\_r} + (\text{Vin\_r} - \text{Vin\_l}) \times \frac{R5}{R8}$$

where:

Vout-l, Vout-r are the output signals of the left-hand and right-hand channel respectively and Vin-l, Vin-r are the input signals of the left-hand and right-hand channel respectively.

The above equations show that the output signal materializes in each channel by the difference of the input signals of the two channels multiplied by the resistance ratio resistor R1/R9 and R5/R8 respectively being added to the corresponding input signal. So that both channels achieve a symmetrical response resistor R1 needs to be the same as resistor R5 and resistor R8 the same as resistor R9, i.e. the extent by which the stereobase is widened can be very easily varied and set by changing the ratio of the two cited resistors. In addition, activating/deactivating the widening effect is achievable simply by actuating a switch via which the sound signals themselves are not switched directly but merely the amplifiers activated/deactivated. The circuit assembly requires but a single supply voltage from which at the same time also the signal for blocking the amplifiers 48 and 50 can be derived.

The circuit assembly is easy to configure with the aid of commercially available intergrated circuits containing four operational amplifiers. The circuit assembly may also be put to use in power stereo amplifiers made up of power operational amplifiers for amplifiers 10 and 34.

What is claimed is:

1. A circuit for widening the stereo base in the reproduction of stereophonic sound signals, comprising:

a first amplifier (10) with a non-inverting input (16), an inverting input (18) and an output (20);

a second amplifier (34) with a non-inverting input (36), an inverting input (42) and an output (40);

right-hand channel signals being applied to the non-inverting input of the first amplifier and the output of the first amplifier being fed back to its inverting input through a first resistor (R1);

left-hand channel signals being applied to the non-inverting input of the second amplifier and the output of the second amplifier being fed back to its inverting input through a second resistor (R5);

further comprising a first buffer amplifier (50) with a non-inverting input (54), an inverting input (58) and an output (62) connected to the inverting input; and a second buffer (48) amplifier with a non-inverting input (52), an inverting input (56) and an output (60) connected to the inverting input;

the first buffer amplifier having its output connected to the inverting input of the first amplifier through a third resistor (R9) and its non-inverting connected to the inverting input of the second amplifier; and the second buffer amplifier having its output connected to the inverting input of the second amplifier through a fourth resistor (R8) and its non-inverting connected to the inverting input of the first amplifier.

2. The circuit of claim 1, wherein the first and second buffer amplifiers are selectively switched between a signal passing condition and a signal blocking condition by application of a control voltage.

3. The circuit of claim 2, wherein the control voltage is a supply voltage.

4. The circuit of claim 2, wherein the control voltage is a ground.

5. The circuit of claim 1, wherein the first and second amplifiers have outputs $$\text{Vout\_I} = \text{Vin\_I} + (\text{Vin\_I} - \text{Vin\_r}) * \frac{R1}{R9}, \text{ and}$$

$$\text{Vout\_r} = \text{Vin\_r} + (\text{Vin\_r} - \text{Vin\_I}) * \frac{R5}{R8},$$

respectively, wherein

Vin_l is a left-hand input signal, and Vin__r is a right-hand input signal, and R1, R5, R9 and R8 are the resistance values of the first, second, third and fourth resistors.

6. An amplifier circuit, comprising:

first amplifier (10) with a non-inverting input (16), an inverting input (18) and an output (20);

a second amplifier (34) with a non-inverting input (36), an inverting input (42) and an output (40);

right-hand channel signals being applied to the non-inverting input of the first amplifier and the output of the first amplifier being fed back to its inverting input through a first resistor (R1);

left-hand channel signals being applied to the non-inverting input of the second amplifier and the output of the second amplifier being fed back to its inverting input through a second resistor (R5);

further comprising a first buffer amplifier (50) with a non-inverting input (54), an inverting input (58) and an output (62) connected to the inverting input; and a second buffer (48) amplifier with a non-inverting input (52), an inverting input (56) and an output (60) connected to the inverting input;

the first buffer amplifier having its output connected to the inverting input of the first amplifier through a third resistor (R9) and its non-inverting connected to the inverting input of the second amplifier; and the second buffer amplifier having its output connected to the inverting input of the second amplifier through a fourth resistor (R8) and its non-inverting connected to the inverting input of the first amplifier.

7. The circuit of claim 6, wherein the first and second buffer amplifiers are selectively switched between a signal passing condition and a signal blocking condition by application of a control voltage.

8. The circuit of claim 7, wherein the control voltage is a supply voltage.

9. The circuit of claim 7, wherein the control voltage is a ground.

10. The circuit of claim 6, wherein the first and second amplifiers have outputs $$\text{Vout\_l} = \text{Vin\_l} + (\text{Vin\_l} - \text{Vin\_r}) * \frac{R1}{R9}, \text{ and}$$

$$\text{Vout\_r} = \text{Vin\_r} + (\text{Vin\_r} - \text{Vin\_l}) * \frac{R5}{R8},$$

respectively, wherein

Vin_l is a left-hand input signal, and Vin_r is a right-hand input signal, and R1, R5, R9 and R8 are the resistance values of the first, second, third and fourth resistors.

* * * * *